(12) United States Patent
Li et al.

(10) Patent No.: US 12,250,779 B2
(45) Date of Patent: Mar. 11, 2025

(54) SUPPORTING STRUCTURE AND FOLDABLE DISPLAY APPARATUS

(71) Applicant: Huawei Technologies Co., Ltd., Shenzhen (CN)

(72) Inventors: Yin Li, Shanghai (CN); Chunjun Ma, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 466 days.

(21) Appl. No.: 17/606,178

(22) PCT Filed: Apr. 21, 2020

(86) PCT No.: PCT/CN2020/085932
§ 371 (c)(1),
(2) Date: Oct. 25, 2021

(87) PCT Pub. No.: WO2020/221064
PCT Pub. Date: Nov. 5, 2020

(65) Prior Publication Data
US 2022/0217857 A1  Jul. 7, 2022

(30) Foreign Application Priority Data

Apr. 30, 2019 (CN) .......................... 201910363515.0

(51) Int. Cl.
*H05K 5/02* (2006.01)
*H04M 1/02* (2006.01)
*H05K 5/00* (2006.01)

(52) U.S. Cl.
CPC ........ *H05K 5/0217* (2013.01); *H04M 1/0214* (2013.01); *H04M 1/0268* (2013.01); *H05K 5/0017* (2013.01)

(58) Field of Classification Search
CPC . H05K 5/0217; H05K 5/0017; H04M 1/0214; H04M 1/0268; H04M 1/0216;
(Continued)

(56) References Cited

U.S. PATENT DOCUMENTS

| 3,338,285 A | * | 8/1967 | Jaster | B65D 33/2541 383/65 |
| 7,140,774 B2 | * | 11/2006 | Galkiewicz | A44B 18/0053 384/42 |

(Continued)

FOREIGN PATENT DOCUMENTS

| CN | 104851365 A | 8/2015 |
| CN | 105430132 A | 3/2016 |

(Continued)

*Primary Examiner* — Anthony M Haughton
*Assistant Examiner* — Theron S Milliser
(74) *Attorney, Agent, or Firm* — Conley Rose, P.C.

(57) ABSTRACT

A supporting structure that supports a flexible screen includes planar supporting portions and a bending supporting portion. The bending supporting portion includes a bending skeleton and a flexible supporting bar coupled to the bending skeleton, and the flexible supporting bar is in direct contact with the flexible screen. The flexible supporting bar includes a supporting portion and a plurality of connecting portions that are distributed at intervals and fastened to the supporting portion. The supporting portion is coupled to the flexible screen. The connecting portions are located on a side of the supporting portion away from the flexible screen, and an end of each of the plurality of connecting portions away from the supporting portion is coupled to the bending skeleton.

20 Claims, 10 Drawing Sheets

(58) Field of Classification Search
CPC .. H04M 1/0266; G06F 1/1637; G06F 1/1641; G06F 1/1652; G09F 9/301
See application file for complete search history.

(56) References Cited

U.S. PATENT DOCUMENTS

| | | | | |
|---|---|---|---|---|
| 8,826,499 | B2* | 9/2014 | Tempesta | A44B 19/267 24/406 |
| 9,174,142 | B2* | 11/2015 | Lee | G09B 1/30 |
| 9,565,903 | B2* | 2/2017 | Tempesta | A44B 19/02 |
| 9,569,018 | B2* | 2/2017 | Kang | G06F 3/03 |
| 9,823,696 | B2* | 11/2017 | Vänska | H04M 1/0202 |
| 10,334,723 | B2* | 6/2019 | Wald | H05K 1/0281 |
| 10,590,973 | B2* | 3/2020 | Cosgrove | H10K 50/84 |
| 11,137,005 | B2* | 10/2021 | Cosgrove | H10K 59/87 |
| 11,815,947 | B2* | 11/2023 | Lee | G06F 1/1637 |
| 2004/0170341 | A1* | 9/2004 | Galkiewicz | A44B 18/0053 384/7 |
| 2004/0170342 | A1* | 9/2004 | Galkiewicz | A44B 18/0053 384/42 |
| 2008/0074400 | A1 | 3/2008 | Gettemy et al. | |
| 2012/0304423 | A1* | 12/2012 | Tempesta | A44B 19/267 24/406 |
| 2013/0000089 | A1* | 1/2013 | Lee | G09B 1/30 24/593.1 |
| 2013/0100053 | A1* | 4/2013 | Kang | G06F 3/0445 345/173 |
| 2013/0286553 | A1* | 10/2013 | Vanska | H04M 1/0202 361/679.01 |
| 2014/0366338 | A1* | 12/2014 | Tempesta | A44B 19/02 24/406 |
| 2017/0303414 | A1 | 10/2017 | Chu | |
| 2018/0135674 | A1* | 5/2018 | Cosgrove | H10K 77/111 |
| 2018/0177046 | A1* | 6/2018 | Wald | H10K 50/841 |
| 2018/0351117 | A1 | 12/2018 | Kim | |
| 2020/0173474 | A1* | 6/2020 | Cosgrove | H10K 59/87 |
| 2021/0075895 | A1 | 3/2021 | Cheng | |
| 2022/0206529 | A1* | 6/2022 | Lee | G06F 1/1641 |
| 2023/0050666 | A1* | 2/2023 | Li | G06F 1/1681 |

FOREIGN PATENT DOCUMENTS

| | | |
|---|---|---|
| CN | 106297568 A | 1/2017 |
| CN | 107195795 A | 9/2017 |
| CN | 107437378 A | 12/2017 |
| CN | 207115888 U | 3/2018 |
| CN | 108712530 A | 10/2018 |
| CN | 108877529 A | 11/2018 |
| EP | 3105649 B1 | 9/2021 |
| KR | 20150094479 A | 8/2015 |
| KR | 20160097034 A | 8/2016 |

* cited by examiner

SUPPORTING STRUCTURE AND FOLDABLE DISPLAY APPARATUS

CROSS-REFERENCE TO RELATED APPLICATIONS

This is a U.S. National Stage of International Patent Application No. PCT/CN2020/085932 filed on Apr. 21, 2020, which claims priority to Chinese Patent Application No. 201910363515.0 filed on Apr. 30, 2019. Both of the aforementioned applications are hereby incorporated by reference in their entireties.

TECHNICAL FIELD

This application relates to the field of foldable display apparatus technologies, and in particular, to a supporting structure and a foldable display apparatus.

BACKGROUND

A foldable mobile phone with a flexible screen is an important development trend of modern mobile phones. The flexible screen usually includes planar regions and a bending region connecting two adjacent planar regions. Correspondingly, to a structure of the foldable flexible screen, a supporting structure of the foldable mobile phone with a flexible screen includes planar supporting portions opposite to the planar regions and a bending supporting portion opposite to the bending region.

In a conventional technology, the flexible screen is bonded and fastened to the supporting structure. The bending supporting portion includes an intermediate skeleton and a flexible supporting bar injection-molded with the intermediate skeleton, and the flexible screen is bonded and fastened to the flexible supporting bar. In a process of using the foldable mobile phone with a flexible screen, during folding and unfolding operations, the bending supporting portion and the bending region of the flexible screen are simultaneously bent or unfolded, and the bending supporting portion and the flexible screen each have a specified thickness. In a process of performing unfolding and bending operations for a plurality of times, the flexible screen needs to stretch and contract. Consequently, degumming is likely caused between the flexible screen and the bending supporting portion, resulting in poor products.

SUMMARY

This application provides a supporting structure of a foldable display apparatus and a foldable display apparatus, to improve strength of connection between a flexible screen and a bending supporting portion, and improve product quality of the foldable display apparatus.

According to a first aspect, this application provides a supporting structure of a foldable display apparatus, where the supporting structure of the foldable display apparatus is configured to support a flexible screen of the foldable display apparatus. The flexible screen includes two types of regions: planar regions and a bending region. Specifically, the flexible screen includes at least two planar regions and a bending region connected between the two planar regions. Correspondingly, to reliably support the flexible screen, the supporting structure of the foldable display apparatus includes two types of parts: planar supporting portions and a bending supporting portion. The planar supporting portions are opposite to the planar regions and support the planar regions of the flexible screen, and the bending supporting portion is opposite to the bending region and supports the bending region of the flexible screen. The bending supporting portion includes two parts: a bending skeleton and a flexible supporting bar connected to the bending skeleton, and the flexible supporting bar is in direct contact with the flexible screen. When the flexible screen is unfolded, the flexible supporting bar is configured to support the bending region of the flexible screen, and when the flexible screen is folded, the flexible supporting bar is configured to drive the flexible screen to be folded. In this technical solution, the flexible supporting bar includes at least two parts: a supporting portion and a plurality of connecting portions that are distributed at intervals and fastened to the supporting portion. The supporting portion is connected to the flexible screen. The plurality of connecting portions are located on a side of the supporting portion away from the flexible screen, and the plurality of connecting portions are distributed at intervals. In this case, an end of the connecting portion away from the supporting portion is connected to the bending skeleton. Therefore, there is a specified distance from a joint between the flexible supporting bar and the bending skeleton to the supporting portion. In addition, there is also a specified distance between two adjacent joints. In the foldable display apparatus, the flexible screen is bonded and fastened to the supporting portion of the flexible supporting bar. When the foldable display apparatus is folded, the supporting portion and the flexible screen are bent together, and the supporting portion is connected to the bending skeleton by using the plurality of connecting portions distributed at intervals. Therefore, during bending, relative displacement is generated between the supporting portion and the bending skeleton, so that no relative displacement is likely generated between the supporting portion and the flexible screen. This improves strength of connection between the supporting portion and the flexible screen, reduces a risk of degumming between the flexible screen and the flexible supporting bar, and improves product quality of the foldable display apparatus.

In an optional technical solution, the connecting portions may be clamping slot structures, and the bending skeleton includes clamping heads clamped with the clamping slot structures. When the supporting structure of the foldable display apparatus is mounted, the clamping head extends into the clamping slot structure for clamping, to implement connection between the flexible supporting bar and the bending skeleton. When the foldable display apparatus is folded, the supporting portion and the flexible screen are bent together, and displacement is generated between the clamping slot of the supporting portion and the bending skeleton, so that no relative displacement is likely generated between the supporting portion and the flexible screen. This improves strength of connection between the supporting portion and the flexible screen, reduces a risk of degumming between the flexible screen and the flexible supporting bar, and improves product quality of the foldable display apparatus.

In another optional technical solution, the connecting portions may be fixed protrusions, the plurality of fixed protrusions are located on a side of the supporting portion away from the flexible screen, and an end of each of the plurality of fixed protrusions away from the supporting portion is connected to the bending skeleton. Therefore, there is a specified distance from the joint between the flexible supporting bar and the bending skeleton to the supporting portion. In the foldable display apparatus, the flexible screen is bonded and fastened to the supporting portion of the flexible supporting bar. When the foldable display apparatus is folded, the supporting portion and the flexible screen are bent together, and displacement is generated between the fixed protrusion of the supporting portion and the bending skeleton, so that no relative displacement is likely generated between the supporting portion and the flexible screen. This improves strength of connection between the supporting portion and the flexible screen.

Specifically, there are a plurality of manners in which the fixed protrusion of the flexible supporting bar is connected to the bending skeleton. In a connection manner, the fixed protrusion of the flexible supporting bar is clamped with the bending skeleton. Specifically, the fixed protrusions have fasteners, the bending skeleton includes bayonets in one-to-one adaptation with the fasteners of the fixed protrusions, the fastener may be clamped with the bayonet, and the fastener of the fixed protrusion extends into the bayonet and is clamped with the bayonet. This solution facilitates mounting. In particular, the flexible supporting bar is flexible. Therefore, the fastener may contract and deform to pass through the bayonet, and spring back after passing through the bayonet, to be clamped with the bayonet. In this solution, when the bending supporting portion is bent, a small amount of displacement may be alternatively generated between the fastener and the bayonet, but an effect of connection between the fastener and the bayonet may not be affected. Therefore, relative displacement generated between layers in a folding region when the foldable display apparatus is folded may be further absorbed. In this way, this can improve strength of connection between the supporting portion and the flexible screen, and reduce a disk of degumming between the flexible screen and the flexible supporting bar.

A manner for connection between the fastener and the bayonet further includes different implementation solutions. For example, the bayonet may be a groove, or may be a through hole.

When the bayonet is a groove, an opening of the groove has a clamping edge. To be specific, a size of the opening of the groove is less than a size of a bottom region of the groove. After the fastener contracts to pass through the clamping edge, the fastener springs back to be accommodated inside the groove, and the fastener is clamped with the clamping edge of the opening, to complete clamping between the flexible supporting bar and the bending skeleton. In this technical solution, because the groove has a slot wall, a structure is relatively regular, and no structural interference likely occurs between the fixed protrusion and another structure. In addition, the groove may further protect the fixed protrusion, so that the fixed protrusion is not likely damaged.

When the bayonet is a through hole, after the fastener of the fixed protrusion contracts to pass through the through hole, the fastener springs back and is clamped with an edge of the through hole, to complete clamping between the flexible supporting bar and the bending skeleton. A structure of the through hole is relatively simple, and therefore a manufacturing process can be simplified.

In another manner for connection between the flexible supporting bar and the bending skeleton, an end of the fixed protrusion of the flexible supporting bar away from the supporting portion is fastened to the bending skeleton. In this solution, the bending skeleton includes mounting portions in one-to-one adaptation with the fixed protrusions, and the fixed protrusion is fastened to the mounting portion, to complete mounting and connection between the flexible supporting bar and the bending skeleton.

To improve stability of mounting between the fixed protrusion and the mounting portion, the mounting portion has a mounting hole. The fixed protrusion passes through the mounting hole of the mounting portion and is then fastened to the mounting portion. Therefore, a hole wall of the mounting hole can limit the fixed protrusion to some extent. In this way, a region in which the fixed protrusion is fixedly connected to the mounting portion does not likely fall off.

A manner for fixed connection between the fixed protrusion and the bending skeleton further includes different implementation solutions. For example, the fixed protrusion may be bonded and fastened to the mounting portion. A process in this solution is relatively simple. Alternatively, the fixed protrusion may be hot-melt in the mounting portion. In this solution, connection is relatively stable, and falling-off does not likely occur.

In a specific implementation, a shape of the foregoing connecting portion is not specifically limited. For example, the connecting portions may be bar-shaped connecting portions or dot-shaped connecting portions. The shape of the connecting portion may be selected based on an actual product requirement.

In a further implementation, when the connecting portions are bar-shaped connecting portions, the bar-shaped connecting portions extend in an extension direction of the flexible supporting bar, and the plurality of bar-shaped connecting portions are disposed in parallel. Specifically, when the foldable display apparatus is folded, a folding direction is perpendicular to the extension direction of the flexible supporting bar. Therefore, in this technical solution, the bar-shaped connecting portions do not need to be bent drastically, and a region between the bar-shaped connecting portions in parallel may be bent drastically, to facilitate a bending operation. In addition, the bar-shaped connecting portions are not likely damaged. This improves a service life.

In another implementation, when the connecting portions are dot-shaped connecting portions, the dot-shaped connecting portions are arranged in a matrix on the supporting portion. In an aspect, a relatively reliable connection relationship can be provided. In another aspect, there are bar-shaped gaps between the dot-shaped connecting portions that are arranged in a matrix, to facilitate a folding operation on the foldable display apparatus.

In an optional technical solution, the flexible screen may have one bending region, or may have two or more bending regions. Correspondingly, the supporting structure of the foldable display apparatus in this application may include one bending supporting portion, or may include two bending supporting portions. The technical solution of this application can be used provided that the foldable display apparatus includes the bending supporting portion, to improve strength of connection between the flexible screen and the bending supporting portion, and improve product quality of the foldable display apparatus.

According to a second aspect, this application further provides a foldable display apparatus, where the foldable display apparatus includes a flexible screen and the supporting structure of the foldable display apparatus in any one of the foregoing technical solutions. A bending supporting portion of the supporting structure includes a flexible supporting bar and a bending skeleton. Distal ends of connecting portions of the flexible supporting bar are fixedly connected to the bending skeleton. Therefore, there may be space for relative movement between the flexible supporting bar and the bending skeleton. When the foldable display apparatus is bent, the flexible screen may be stably connected to a supporting portion of the supporting bar, and degumming does not likely occur, so that product quality of the foldable display apparatus is relatively high.

In a specific implementation, a folding direction of the foregoing foldable display apparatus is not limited. The foldable display apparatus may be folded in a direction towards the flexible screen. To be specific, after being folded, the flexible screen is located between supporting housings of the foldable display apparatus. Alternatively, in another specific embodiment, the foldable display apparatus may be folded in a direction away from the flexible screen. To be specific, after being folded, the flexible screen is located on outer sides of supporting housings of the foldable display apparatus.

REFERENCE NUMERALS

1—Flexible screen;
11—Display panel;
12—Cover;
13—Bonding region;
14—Planar region;
15—Bending region;
2—Supporting structure;
21—Bonding step;
22—Planar supporting portion;
23—Bending supporting portion;
231—Bending skeleton;
2312—Clamping head;
2313—Head;
2314—Clamping neck;
2315—Bayonet;
2316—Groove;
2317—Clamping edge;
2318—Through hole;
2319—Mounting portion;
2320—Mounting hole;
232—Flexible supporting bar;
2321—Supporting portion;
2322—Connecting portion;
2323—Clamping slot;
2324—Slot hole;
2325—Clamping wall;
2326—Fixed protrusion;
2327—Bar-shaped connecting portion; and
2328—Dot-shaped connecting portion.

DESCRIPTION OF EMBODIMENTS

To make the objectives, technical solutions, and advantages of this application clearer, the following further describes this application in detail with reference to the accompanying drawings.

To facilitate understanding of a supporting structure of a foldable display apparatus provided in the embodiments of this application, the following first describes an application scenario of the supporting structure. The supporting structure of the foldable display apparatus is applied to a foldable mobile terminal, for example, a foldable mobile phone or a foldable ebook. When the mobile phone is folded, a flexible screen of the mobile terminal is also folded. To fold the flexible screen, the flexible screen includes two types of regions: planar regions and a bending region connecting two adjacent planar regions. The supporting structure of the foldable display apparatus includes planar supporting portions and a bending supporting portion. The planar supporting portions are opposite to the planar regions, and the bending supporting portion is opposite to the bending region. When the flexible screen is folded, the bending region of the flexible screen and the bending supporting portion that supports the bending region need to be folded together. When the flexible screen of the mobile phone is unfolded, the bending region of the flexible screen and the bending supporting portion that supports the bending region are also unfolded together. During folding and unfolding, the flexible screen and the bending supporting portion each have a specified thickness, and the bending supporting portion has an integral structure. As a result, specified relative displacement is generated between the flexible screen and the bending supporting portion in the bending region, and a risk of degumming likely occurs. Therefore, a supporting structure of the foldable display apparatus needs to be designed, to reduce a risk of degumming between the flexible screen and the bending supporting portion, and improve product quality.

Figure 1:
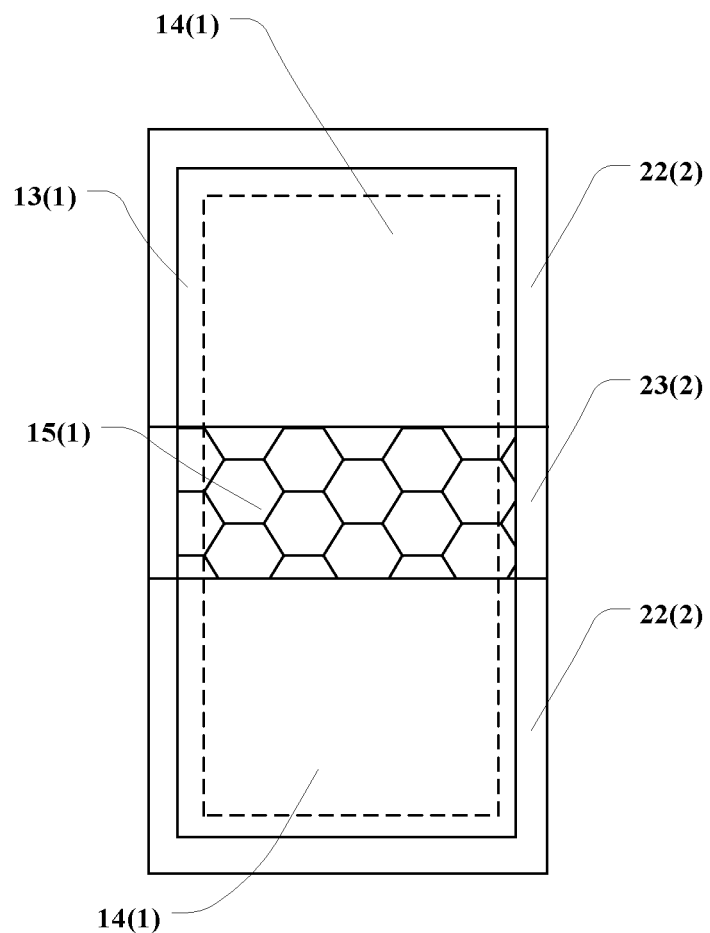
FIG. 1 is a top view of a foldable display apparatus according to an embodiment of this application.
Figure 2:
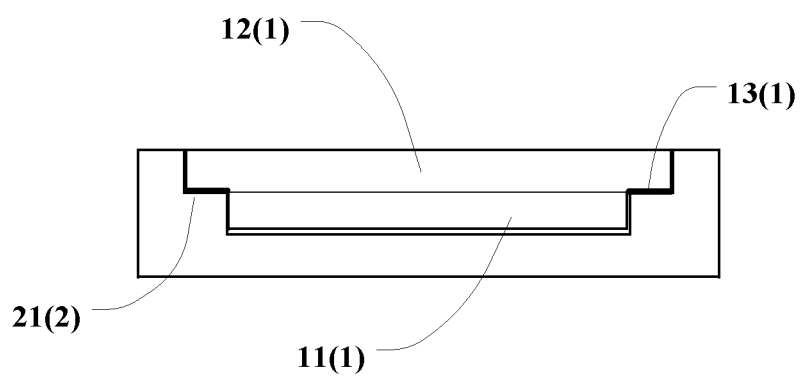
FIG. 2 is a schematic cross-sectional diagram of a foldable display apparatus according to an embodiment of this application.
Figure 3:
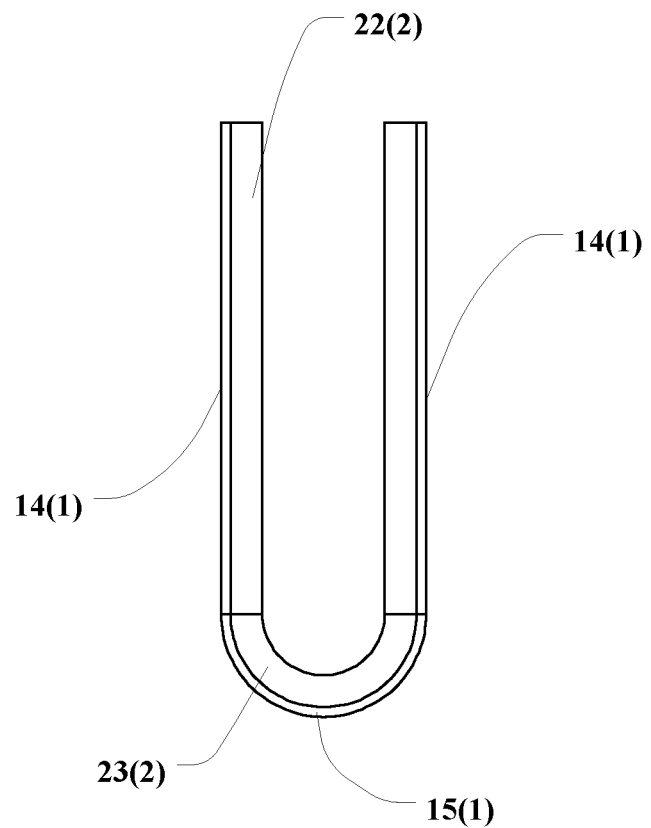
FIG. 3 is a schematic diagram of a folded state of a foldable display apparatus according to an embodiment of this application.
Figure 4:
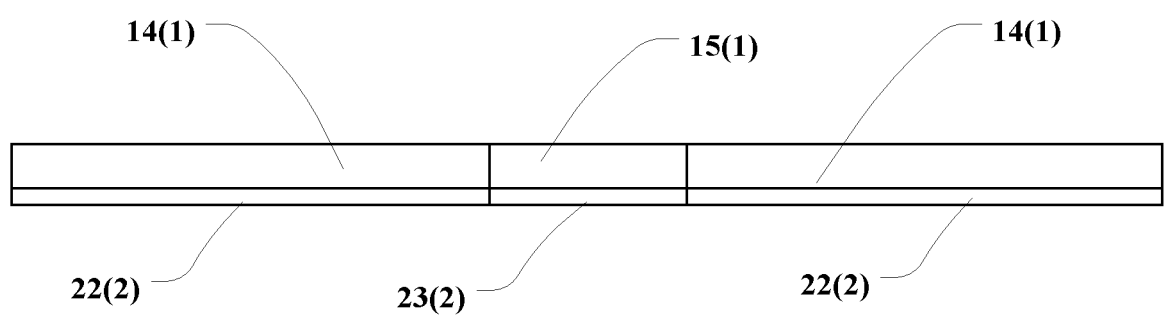
FIG. 4 is a schematic diagram of an unfolded state of a foldable display apparatus according to an embodiment of this application.

FIG. 1 is a top view of a foldable display apparatus according to an embodiment of this application, FIG. 2 is a schematic cross-sectional diagram of a foldable display apparatus according to an embodiment of this application, FIG. 3 is a schematic diagram of a folded state of a foldable display apparatus according to an embodiment of this application, and FIG. 4 is a schematic diagram of an unfolded state of a foldable display apparatus according to an embodiment of this application. The supporting structure of the foldable display apparatus in the embodiments of this application is applied to the foldable display apparatus shown in the figures. A supporting structure 2 is configured to support a flexible screen 1 of the foldable display apparatus. As shown in the figures, the foldable display apparatus includes the flexible screen 1 and the supporting structure 2. The supporting structure 2 includes a bonding step 21. The flexible screen 1 has a display panel 11 and a cover 12 that are stacked together. On an edge of the flexible screen 1, the cover 12 extends from an edge of the display panel 11 by a specified distance, so that the cover 12 can be lapped and fastened to the bonding step 21 of the supporting structure 2, to form a bonding region 13 located on the edge of the flexible screen 1. The flexible screen 1 includes at least two planar regions 14 (that the flexible screen 1 includes two planar regions 14 is used as an example in the figures). There is a bending region 15 between any two adjacent planar regions 14. When the foldable display apparatus is in a folded state and an unfolded state, the planar regions 14 remain flattened. When the foldable display apparatus is in the folded state, the bending region 15 is bent. When the foldable display apparatus is in the unfolded state, the bending region 15 is flattened. The foldable display apparatus has a bending supporting portion 23 corresponding to the bending region 15. There is a flexible supporting bar on a side of the bending supporting portion that is close to the flexible screen. The flexible supporting bar is made of a flexible material, for example, rubber, and has specified flexibility. When the flexible screen is bent, the flexible supporting bar may be bent together with the flexible screen.

Figure 5:
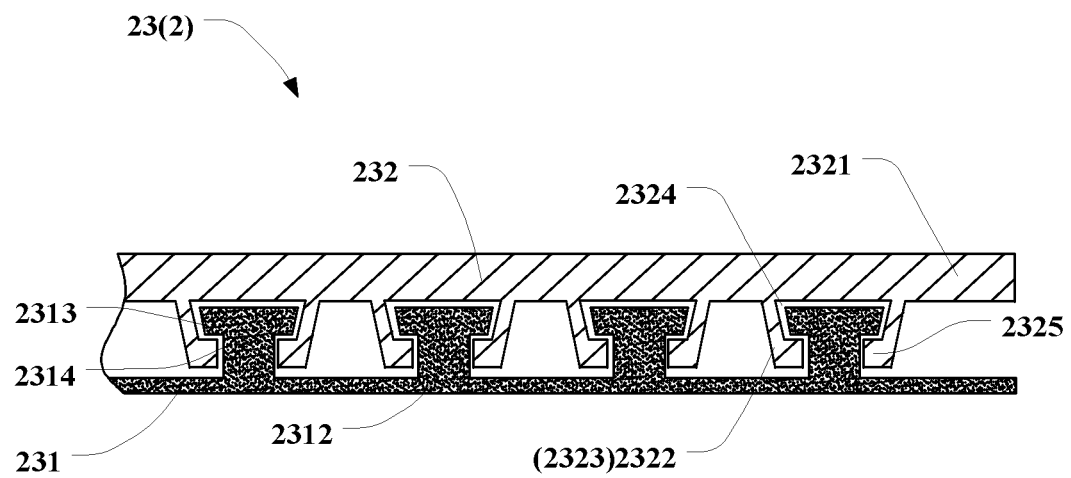
FIG. 5 is a schematic cross-sectional structural diagram of a bending supporting portion according to an embodiment of this application.

Referring to FIG. 3 to FIG. 5, FIG. 5 is a schematic cross-sectional structural diagram of a bending supporting portion according to an embodiment of this application. The supporting structure 2 in this embodiment of this application includes planar supporting portions 22 and a bending supporting portion 23. The planar supporting portions 22 are opposite to the planar regions 14 of the flexible screen 1, and are configured to support the planar regions 14. The bending supporting portion 23 is opposite to the bending region 15 of the flexible screen 1, and is configured to support the bending region 15. The bending supporting portion 23 includes a bending skeleton 231 and a flexible supporting bar 232 connected to the bending skeleton 231, and the flexible supporting bar 232 is in contact with the flexible screen 1 to support the bending portion of the flexible screen 1. Specifically, the flexible supporting bar 232 includes a supporting portion 2321 and a plurality of connecting portions 2322 that are distributed at intervals and fastened to the supporting portion 2321. The supporting portion 2321 is in contact with the flexible screen 1. The connecting portions 2322 are located on a side of the supporting portion 2321 away from the flexible screen 1, an end of the connecting portion 2322 away from the supporting portion 2321 is connected to the bending skeleton 231, and there is a specified interval between the plurality of connecting portions 2322. In this embodiment, the end of the connecting portion 2322 away from the supporting portion 2321 is connected to the bending skeleton 231, so that there is at least a specified distance from a joint between the connecting portion 2322 and the bending skeleton 231 to the supporting portion 2321. The connecting portions 2322 are flexible connecting portions, and there is a specified interval between the plurality of connecting portions 2322. Therefore, when the foldable display apparatus is folded, the flexible screen 1 bonded to the supporting portion 2321 and the supporting portion 2321 are bent together, and relative displacement is generated between the supporting portion 2321 and the bending skeleton 231, so that no relative displacement is likely generated between the supporting portion 2321 and the flexible screen 1. This improves strength of connection between the supporting portion 2321 and the flexible screen 1, reduces a risk of degumming between the flexible screen 1 and the flexible supporting bar 232, and improves product quality of the foldable display apparatus.

It should be noted that, in this embodiment of this application, description is provided by using an example in which the flexible screen has the planar regions and the bending region. Correspondingly, the supporting structure has the planar supporting portions and the bending supporting portion. This implementation is used only as a specific solution for implementing this embodiment of this application. The supporting structure in the technical solution of this application is applicable to all solutions in which the flexible screen has a bending region. The supporting structure correspondingly has the bending supporting portion. A structure of a part other than the bending region of the flexible screen is not limited, for example, the part may be a curved-surface region or in any shape or state, provided that the supporting structure is adapted to the structure.

Figure 6:
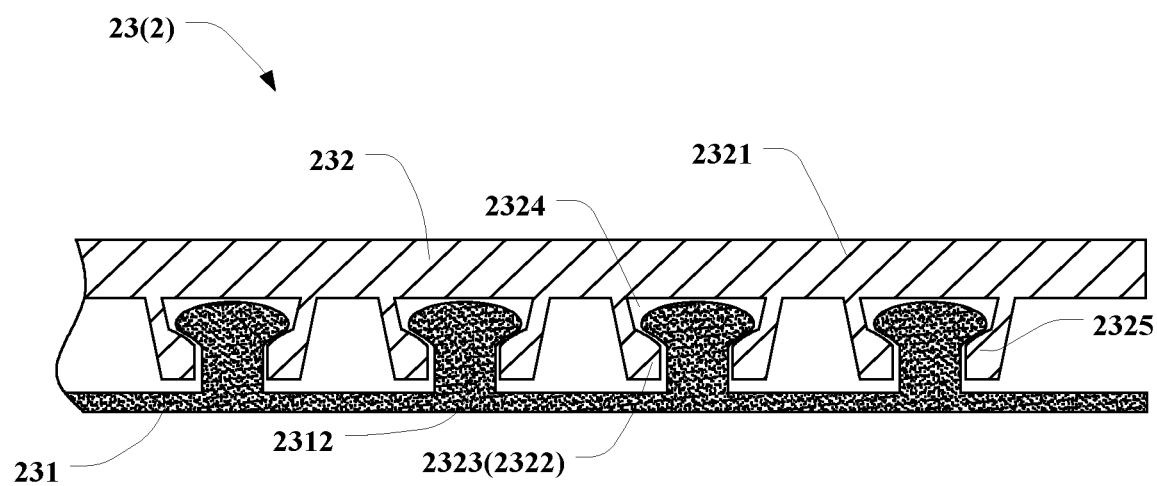
FIG. 6 is a schematic cross-sectional structural diagram of another bending supporting portion according to an embodiment of this application.
Figure 7:
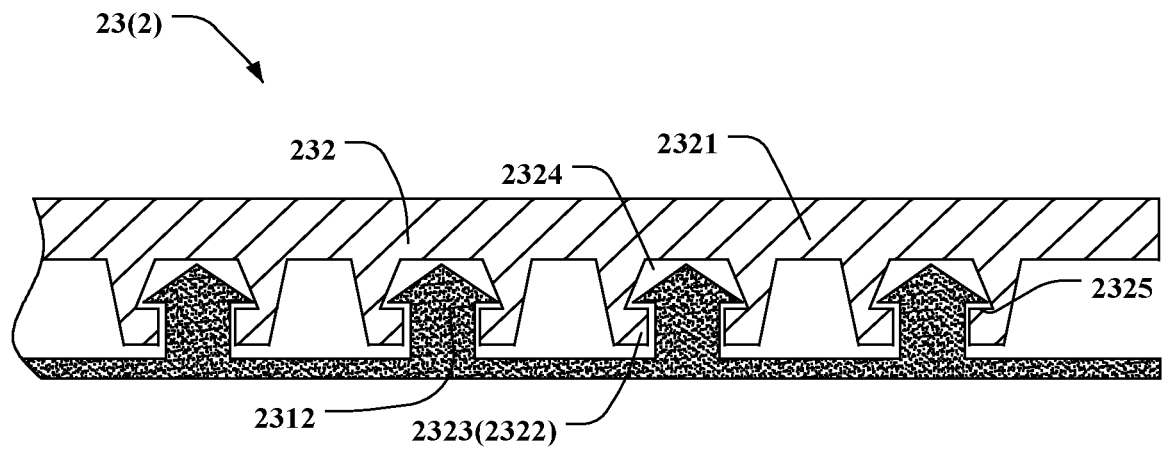
FIG. 7 is a schematic cross-sectional structural diagram of another bending supporting portion according to an embodiment of this application.

In an optional embodiment, there are a plurality of manners in which the connecting portions 2322 are connected to the bending skeleton 231. For example, the connecting portions 2322 may be clamped with the bending skeleton 231, or may be fixedly connected to the bending skeleton 231, and a structure of the connecting portion 2322 may be a clamping slot 2323, or may be a fixed protrusion 2326. As shown in FIG. 5 to FIG. 7, FIG. 6 is a schematic cross-sectional structural diagram of another bending supporting portion according to an embodiment of this application, and FIG. 7 is a schematic cross-sectional structural diagram of another bending supporting portion according to an embodiment of this application. In an optional embodiment, the connecting portions 2322 are clamped with the bending skeleton 231, the connecting portions 2322 are clamping slots 2323, the bending skeleton 231 includes clamping heads 2312, and the clamping head 2312 extends into the clamping slot 2323 and is clamped with the clamping slot 2323. In this embodiment, the connecting portion 2322 of the flexible supporting bar 232 is made of a flexible material. Therefore, the clamping slot 2323 is also a flexible clamping slot 2323. The flexible clamping slot 2323 has a slot hole 2324. There is a clamping wall 2325 on a side of the slot hole 2324 that is close to the bending skeleton 231. The bending skeleton 231 has the clamping heads 2312. The clamping head 2312 has a head 2313 and a clamping neck 2314. A radial size of the head 2313 of the clamping head 2312 is greater than a radial size of the clamping neck 2314, and the head 2313 of the clamping head 2312 is close to a side of the flexible supporting bar 232. During mounting, the head 2313 of the clamping head 2312 passes through a region of the clamping wall 2325 of the clamping slot 2323, and the clamping wall 2325 elastically expands, so that the head 2313 of the clamping head 2312 passes through the region of the clamping wall 2325 to enter the slot hole 2324 of the clamping slot 2323. When the clamping neck 2314 is opposite to the clamping wall 2325, the head 2313 of the clamping head 2312 is clamped with the clamping wall 2325 of the slot hole 2324. In this way, when the foldable display apparatus is folded, the bending supporting portion 23 is bent, and the supporting portion 2321 of the flexible supporting bar 232 is connected to the bending bracket by using the clamping slot 2323 and the clamping head 2312, so that the clamping slot 2323 deforms during bending. Therefore, the supporting portion 2321 and the flexible screen 1 fixedly connected to the supporting portion 2321 are bent simultaneously, and no relative displacement is likely generated between the supporting portion 2321 and the flexible screen 1. In this way, this can improve strength of connection between the supporting portion 2321 and the flexible screen 1, reduce a risk of degumming between the flexible screen 1 and the flexible supporting bar 232, and improve product quality of the foldable display apparatus.

As shown in FIG. 5 to FIG. 7, in the foregoing embodiment, cross-sectional shapes of the clamping head and the clamping slot are not specifically limited, and a structure for clamping between the clamping head and the clamping slot is not specifically limited, either. As shown in FIG. 5, in an embodiment, the cross-sectional shape of the clamping head is a rectangle, and the clamping head is clamped with the clamping slot in a planar manner. As shown in FIG. 6, in another embodiment, the cross-sectional shape of the clamping head is an ellipse, and the clamping head is clamped with the clamping slot in a curved-surface manner. In this embodiment, the clamping head has a region whose size gradually increases in a direction away from the bottom of the clamping slot, to facilitate mounting the clamping head to the clamping slot. As shown in FIG. 7, in still another specific embodiment, the cross-sectional shape of the clamping head is a triangle. In this embodiment, a size of the clamping head gradually increases in the direction away from the bottom of the clamping slot, to facilitate mounting.

Figure 8:
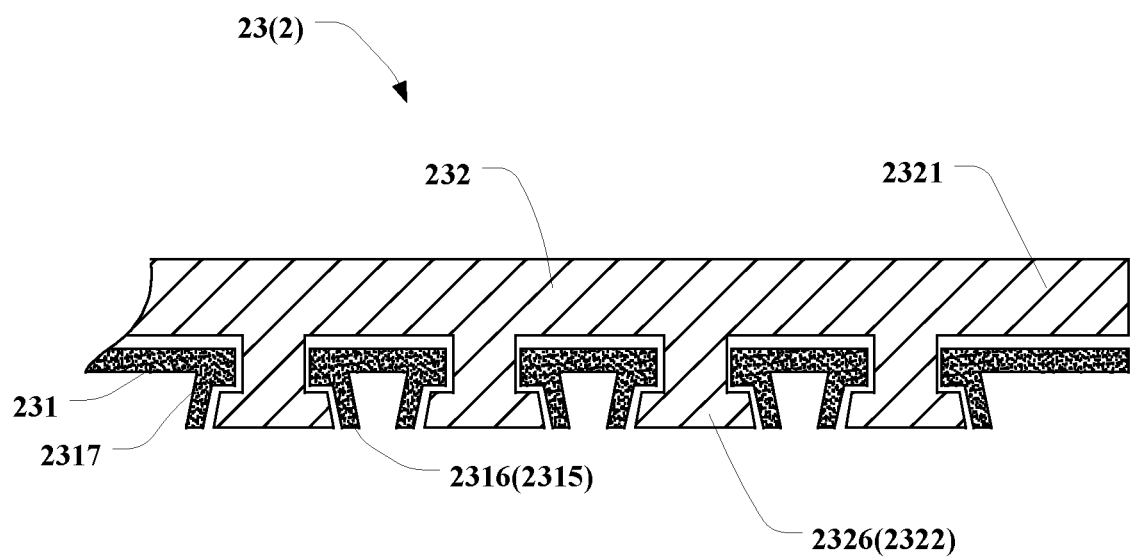
FIG. 8 is a schematic cross-sectional structural diagram of another bending supporting portion according to an embodiment of this application.
Figure 9:
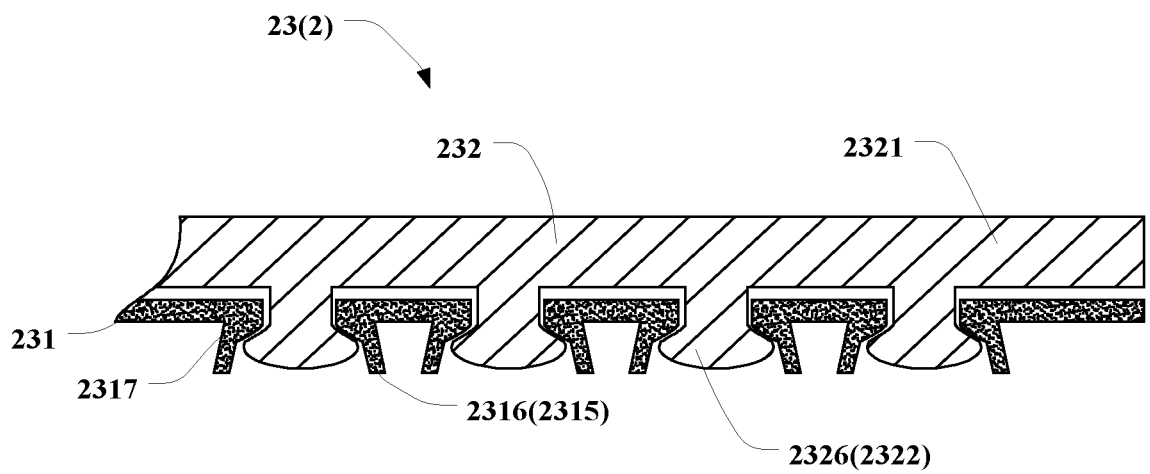
FIG. 9 is a schematic cross-sectional structural diagram of another bending supporting portion according to an embodiment of this application.
Figure 10:
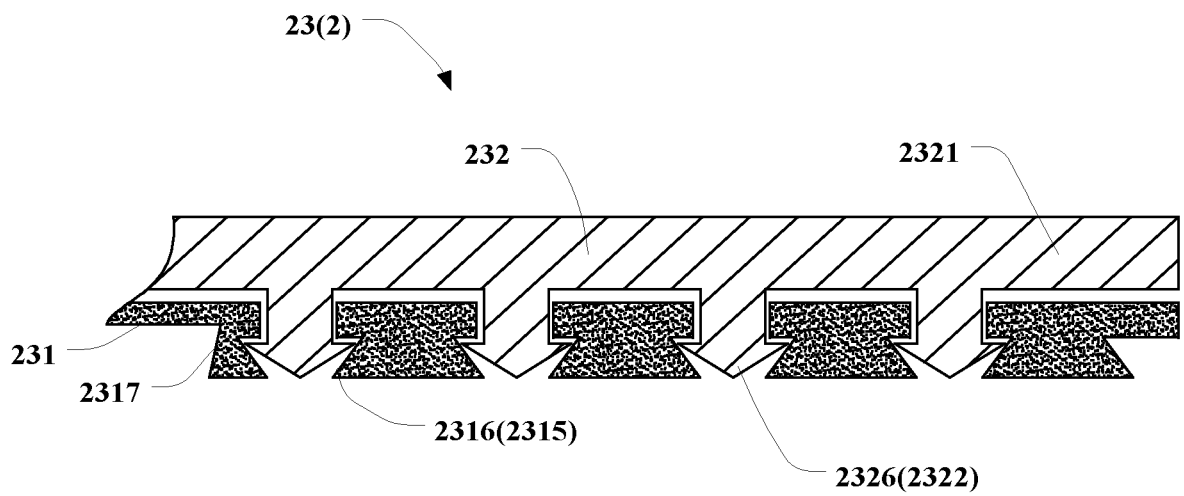
FIG. 10 is a schematic cross-sectional structural diagram of another bending supporting portion according to an embodiment of this application.

FIG. 8 is a schematic cross-sectional structural diagram of another bending supporting portion according to an embodiment of this application, FIG. 9 is a schematic cross-sectional structural diagram of another bending supporting portion according to an embodiment of this application, and FIG. 10 is a schematic cross-sectional structural diagram of another bending supporting portion according to an embodiment of this application. In another optional embodiment, the connecting portions 2322 may be fixed protrusions 2326, and an end of the fixed protrusion 2326 away from the supporting portion 2321 is connected to the bending skeleton 231. Therefore, there is a specified distance from the joint between the connecting portion 2322 and the bending skeleton 231 to the supporting portion 2321. Within the distance, connection is performed by using the fixed protrusion 2326. The fixed protrusion 2326 is flexible and has relatively high flexibility. In this way, when the foldable display apparatus is folded, the bending supporting portion 23 is bent, and the fixed protrusion 2326 is bent. Therefore, the supporting portion 2321 and the flexible screen 1 fixedly connected to the supporting portion 2321 are bent simultaneously, and no relative displacement is likely generated between the supporting portion 2321 and the flexible screen 1. In this way, this can improve strength of connection between the supporting portion 2321 and the flexible screen 1, reduce a risk of degumming between the flexible screen 1 and the flexible supporting bar 232, and improve product quality of the foldable display apparatus.

Still referring to FIG. 8, in a specific embodiment of this application, the fixed protrusions 2326 may have fasteners, the bending skeleton 231 has bayonets 2315, and the fasteners are in one-to-one adaptation with the bayonets 2315, namely, the fasteners may be clamped with the bayonets 2315. Specifically, the fastener is flexible. When the bending supporting portion 23 is mounted to the bending skeleton 231, the fastener may be inserted into the bayonet 2315 of the bending skeleton 231. The fastener may contract when passing through the bayonet 2315. The fastener returns to an original shape after passing through the bayonet 2315, and may be clamped with the bayonet 2315, so that an end of the fixed protrusion 2326 away from the supporting portion 2321 is connected to the bending skeleton 231. In this embodiment, mounting can be completed by inserting the bayonet 2315 of the fixed protrusion 2326 into the bayonet 2315 of the bending skeleton 231. Therefore, a mounting process is relatively simple.

As shown in FIG. 8 to FIG. 10, in the foregoing embodiment, cross-sectional shapes of the fastener and the bayonet are not specifically limited, and a structure for clamping between the fastener and the bayonet is not specifically limited, either. As shown in FIG. 5, in an embodiment, the cross-sectional shape of the fastener is a rectangle, and the fastener is clamped with the bayonet in a planar manner. As shown in FIG. 6, in another embodiment, the cross-sectional shape of the fastener is an ellipse, and the fastener is clamped with the bayonet in a curved-surface manner. In this embodiment, the fastener has a region whose size gradually increases in a direction away from the bottom of the bayonet, to facilitate mounting the fastener to the bayonet. As shown in FIG. 7, in still another specific embodiment, the cross-sectional shape of the fastener is a triangle. In this embodiment, a size of the fastener gradually increases in the direction away from the bottom of the bayonet, to facilitate mounting.

A manner for connection between the fastener and the bayonet 2315 further includes different implementation solutions. For example, a structure and a shape of the bayonet 2315 are not specifically limited. The bayonet 2315 may be a groove 2316, or may be a through hole 2318. Still referring to FIG. 8, in an optional embodiment, the bayonet 2315 is a groove 2316. An opening of the groove 2316 has a clamping edge 2317. The fastener may pass through the clamping edge 2317 and extends into the groove 2316, and is clamped with the clamping edge 2317. Specifically, the fastener is a flexible fastener. Therefore, when passing through the clamping edge 2317, the fastener contracts to enter the groove 2316, then returns to an original shape, and can be clamped with the clamping edge 2317, to complete mounting. In this embodiment, the fastener is clamped with the groove 2316. Therefore, specified displacement may alternatively occur at a joint between the fastener and the groove 2316, to facilitate absorbing deformation of the bending supporting portion 23, and the connection manner facilitates mounting. In addition, in this embodiment, the fastener is located in the groove 2316. The groove 2316 may protect the fastener, and no friction or structural interference likely occurs between a remaining structure and the fastener.

Figure 11:
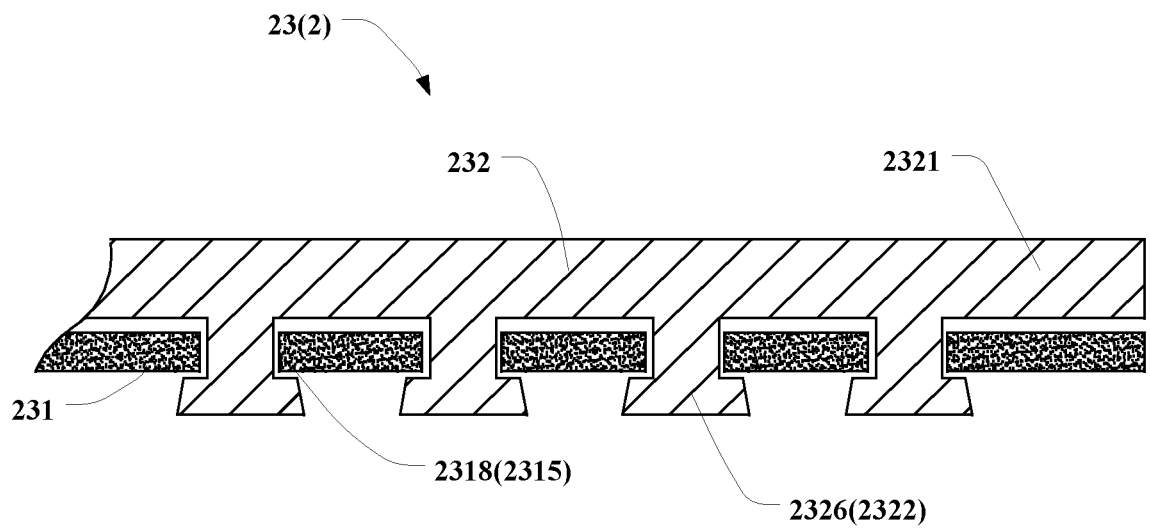
FIG. 11 is a schematic cross-sectional structural diagram of another bending supporting portion according to an embodiment of this application.

FIG. 11 is a schematic cross-sectional structural diagram of another bending supporting portion according to an embodiment of this application. In another optional embodiment, the bayonet 2315 is a through hole 2318, the fastener passes through the through hole 2318, and is then clamped with an edge of the through hole 2318. In this embodiment, a process of mounting the fastener to the through hole 2318 is also relatively convenient, and specified displacement may alternatively occur at a joint between the fastener and the through hole 2318, to facilitate absorbing deformation of the bending supporting portion 23. In addition, in this embodiment, a structure of the through hole 2318 is relatively simple, to simplify a manufacturing process of the bending skeleton 231, and reduce manufacturing costs of the bending skeleton 231.

Figure 12:
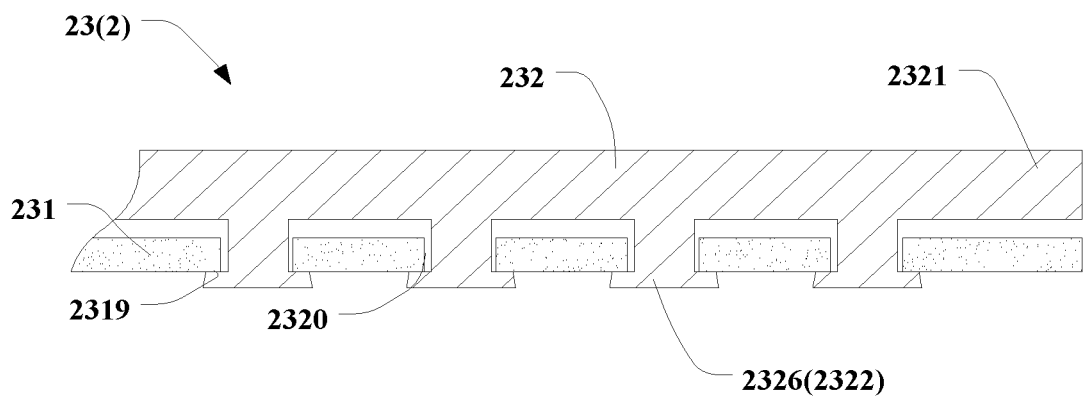
FIG. 12 is a schematic cross-sectional structural diagram of another bending supporting portion according to an embodiment of this application.

FIG. 12 is a schematic cross-sectional structural diagram of another bending supporting portion according to an embodiment of this application. In another implementation of this application, the fixed protrusion 2326 may alternatively be fixedly connected to the bending skeleton 231. Specifically, the bending skeleton 231 may include mounting portions 2319 in one-to-one adaptation with the fixed protrusions 2326. An end of the fixed protrusion 2326 away from the supporting portion 2321 is fastened to the mounting portion 2319. In this embodiment, the end of the fixed protrusion 2326 away from the supporting portion 2321 is fixedly connected to the bending skeleton 231. In this embodiment, a joint between the fixed protrusion 2326 and the bending skeleton 231 is connected to the supporting portion 2321 by using the flexible fixed protrusion 2326, to absorb deformation of the bending supporting portion 23. In this embodiment, strength of connection between the fixed protrusion 2326 and the bending skeleton 231 is relatively high.

Still referring to FIG. 12, in a specific embodiment, the mounting portion 2319 has a mounting hole 2320, and the fixed protrusion 2326 passes through the mounting hole 2320 and is then fastened to the bending skeleton 231. In this embodiment, the fixed protrusion 2326 passes through the mounting hole 2320. Therefore, a hole wall of the mounting hole 2320 may protect the fixed protrusion 2326, to improve a service life of the fixed protrusion 2326. In addition, the hole wall of the mounting hole 2320 may limit the fixed protrusion 2326, to prevent excessively large displacement from being generated between the fixed protrusion 2326 and the bending skeleton 231, and improve strength of connection between the fixed protrusion 2326 and the bending skeleton 231.

In a specific embodiment of this application, a manner for fixed connection between the fixed protrusion 2326 and the bending skeleton 231 is not limited. In a specific implementation, the fixed protrusion 2326 is bonded and fastened to the mounting portion 2319. This connection manner has relatively low costs and a relatively simple process. In another specific implementation, the fixed protrusion 2326 is fastened to the mounting portion 2319 in a hot-melting manner. This connection manner has relatively high strength of fixed connection, and falling-off does not likely occur.

Figure 13:
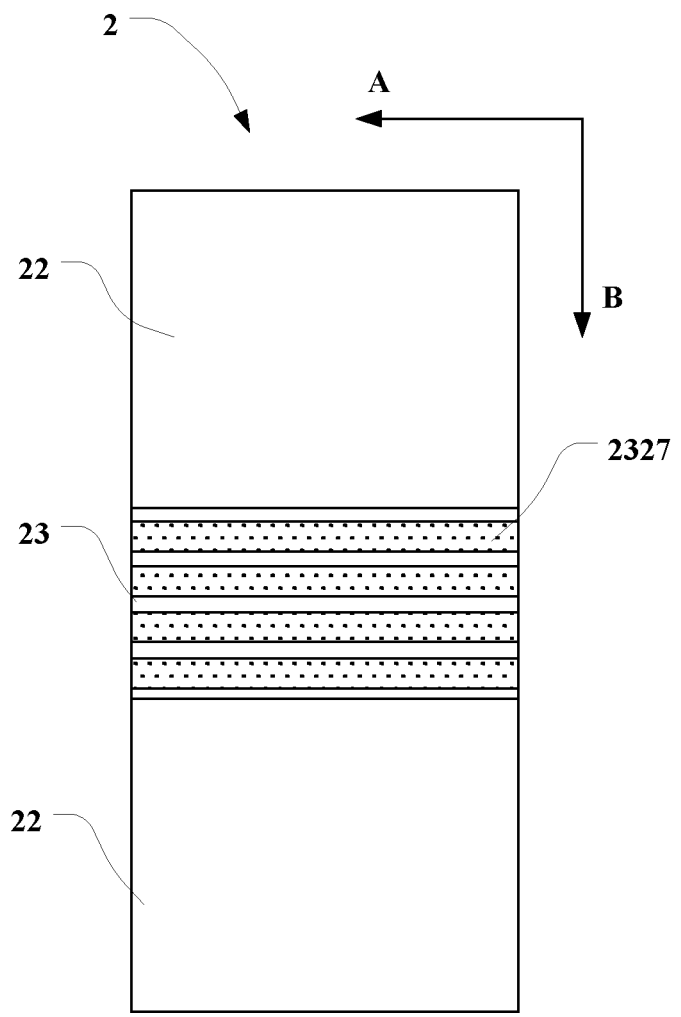
FIG. 13 is a schematic structural diagram of a supporting structure according to an embodiment of this application.

In an optional technical solution, a shape of the connecting portion is not limited. For example, the connecting portions may be bar-shaped connecting portions or dot-shaped connecting portions. The shape of the connecting portion may be selected based on an actual product requirement. FIG. 13 is a schematic structural diagram of a supporting structure according to an embodiment of this application. In a specific embodiment, the connecting portions 2322 are bar-shaped connecting portions 2327, a quantity of bar-shaped connecting portions 2327 required by the flexible supporting bar 232 is relatively small, and a structure of the flexible supporting bar 232 is relatively simple, so that the flexible supporting bar 232 has a simple manufacturing process and relatively low manufacturing costs.

Still referring to FIG. 13, in a specific embodiment, the flexible supporting bar 232 has a plurality of bar-shaped connecting portions 2327, the bar-shaped connecting portions 2327 extend in an extension direction of the flexible supporting bar 232, and the plurality of bar-shaped connecting portions 2327 are arranged in parallel. When the foldable display apparatus is folded, a folding direction is perpendicular to the extension direction of the flexible supporting bar 232. Therefore, in this embodiment of this application, an extension direction of the bar-shaped connecting portion 2327 is perpendicular to the folding direction of the flexible supporting bar 232, so that a folding line of the foldable display apparatus is parallel to a region between the bar-shaped connecting portions 2327. In this way, when the foldable display apparatus is folded, the region between the parallel bar-shaped connecting portions 2327 can be drastically bent, to facilitate a bending operation. In addition, the bar-shaped connecting portions 2327 are not likely damaged. This improves a service life. As shown in FIG. 13, the extension direction of the flexible supporting bar 232 is a direction A, and the folding direction is a direction B.

Figure 14:
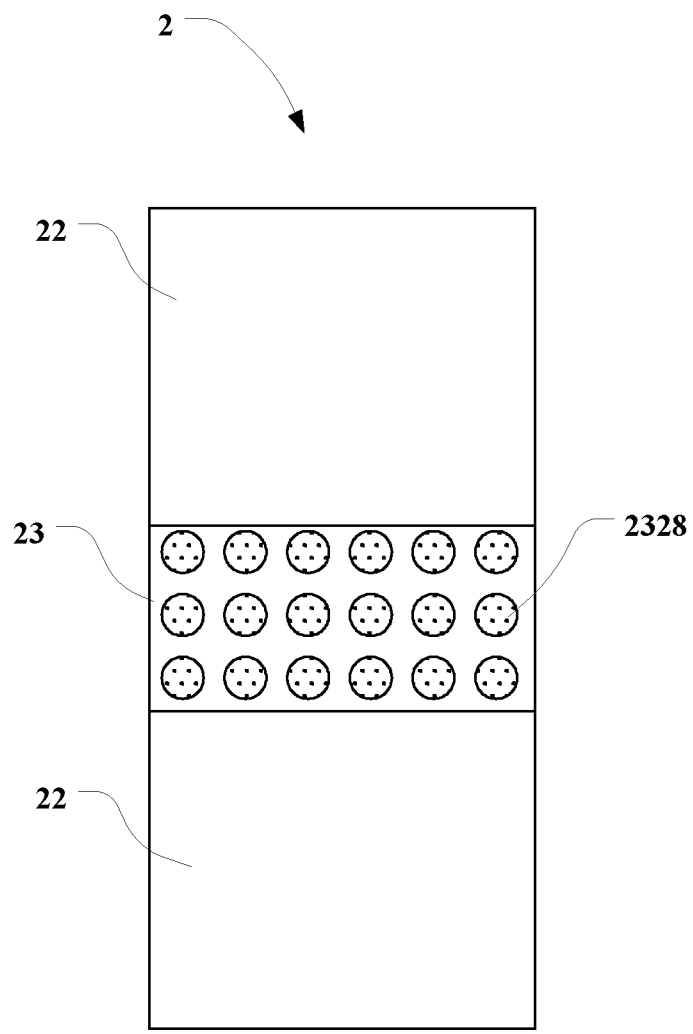
FIG. 14 is a schematic structural diagram of another supporting structure according to an embodiment of this application.

FIG. 14 is a schematic structural diagram of another supporting structure according to an embodiment of this application. In a specific embodiment, when the connecting portions 2322 are dot-shaped connecting portions 2328, the dot-shaped connecting portions 2328 are arranged in a matrix on the supporting portion 2321. In an aspect, the plurality of dot-shaped connecting portions 2328 arranged in a matrix can provide a relatively reliable connection relationship. In another aspect, bar-shaped gaps may be formed between the dot-shaped connecting portions 2328 that are arranged in a matrix, to facilitate a folding operation on the foldable display apparatus.

In a specific embodiment, a cross-sectional shape of the dot-shaped connecting portion in a direction parallel to the flexible screen 1 may be a circle, a square, or a polygon, and a shape of the dot-shaped connecting portion is relatively regular, to facilitate manufacturing.

Figure 15:
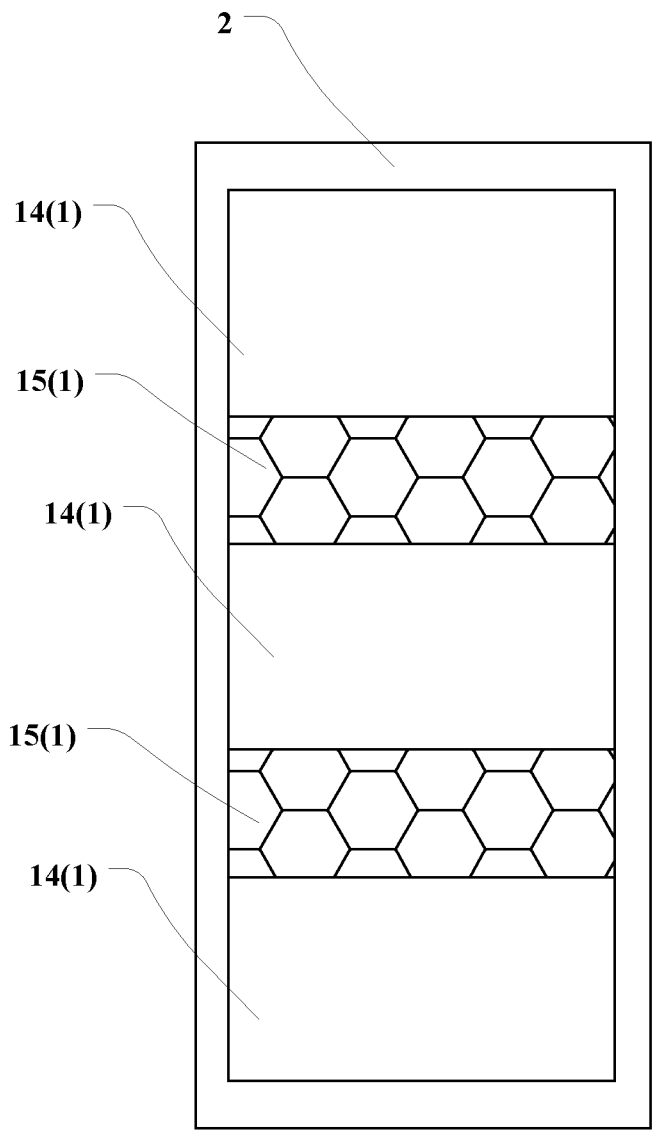
FIG. 15 is a schematic structural diagram of a foldable display apparatus according to an embodiment of this application.

In this embodiment of this application, the flexible screen of the foldable display apparatus may include one bending region, or may include two or more bending regions. Correspondingly, the supporting structure of the foldable display apparatus may include only one bending supporting portion, or may include two or more bending supporting portions. Specifically, a quantity of bending regions included in the foldable display apparatus may be correspondingly the same as a quantity of included bending supporting portions, so that degumming does not likely occur between the flexible screen and the bending supporting portion of the foldable display apparatus. Therefore, strength of connection between the flexible screen and the bending supporting portion of the foldable display apparatus can be improved, and product quality of the foldable display apparatus is relatively good. FIG. 15 is a schematic structural diagram of a foldable display apparatus according to an embodiment of this application. The flexible screen 1 of the foldable display apparatus shown in the figure includes three planar regions 14 and two bending regions 15.

Figure 16:
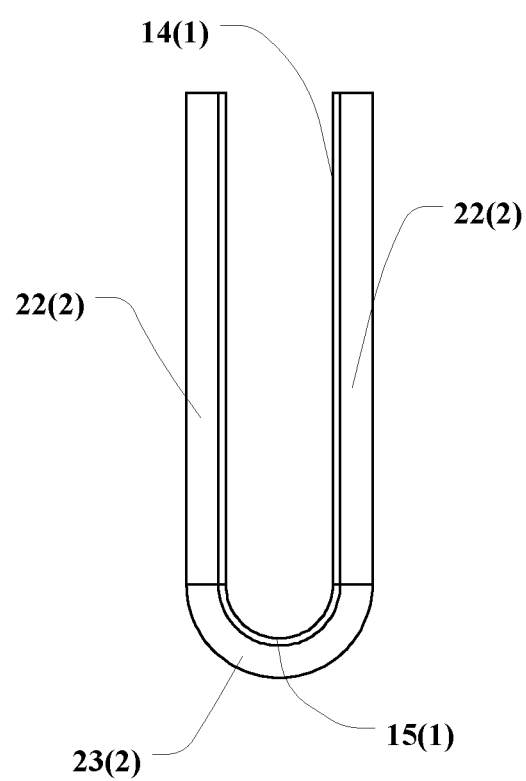
FIG. 16 is a schematic diagram of a folded state of another foldable display apparatus according to an embodiment of this application.

Referring to FIG. 3 and FIG. 16, FIG. 16 is a schematic diagram of a folded state of another foldable display apparatus according to an embodiment of this application. According to a second aspect, this application further provides a foldable display apparatus, where the foldable display apparatus includes a flexible screen 1 and the supporting structure 2 of the foldable display apparatus in any one of the foregoing technical solutions. The supporting structure 2 includes a bending supporting portion 23 that supports a bending region 15 of the flexible screen 1, and planar supporting portions 22 that support planar regions 14 of the flexible screen 1. The bending supporting portion 23 includes a flexible supporting bar 232 and a bending skeleton 231. The flexible supporting bar 232 includes a supporting portion 2321 and connecting portions fastened to a side of the supporting portion 2321 away from the flexible screen 1. Distal ends of the connecting portions are fixedly connected to the bending skeleton 231. Therefore, there may be space for relative movement between the flexible supporting bar 232 and the bending skeleton 231. When the foldable display apparatus is bent, the flexible screen 1 may be stably connected to the supporting portion of the supporting bar, and degumming does not likely occur, so that product quality of the foldable display apparatus is relatively high.

In a specific implementation, a folding direction of the foregoing foldable display apparatus is not limited. As shown in FIG. 16, the foldable display apparatus may be folded in a direction towards the flexible screen 1. To be specific, after being folded, the flexible screen 1 is located between supporting housings of the foldable display apparatus. Alternatively, as shown in FIG. 3, in another specific embodiment, the foldable display apparatus may be folded in a direction away from the flexible screen 1. To be specific, after being folded, the flexible screen 1 is located on outer sides of supporting housings of the foldable display apparatus.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A supporting structure comprising:
    a bending supporting portion configured to support a bending region of a foldable display apparatus, wherein the bending supporting portion comprises:
        a bending skeleton comprising clamping heads, wherein the clamping heads are aligned in respective and parallel first planes; and
        a flexible supporting bar configured to be in direct contact with a flexible display screen of the foldable display apparatus and comprising:
            a first side configured to fasten in a second plane to a part of the flexible display screen of the foldable display apparatus that is located in the bending region, wherein the second plane is parallel to an unfolded surface of the flexible display screen, and wherein the second plane is perpendicular to the first planes; and
            a second side coupled to the bending skeleton via connecting portions that are distributed at intervals, wherein the connecting portions comprise clamping slots that clamp with the clamping heads to secure a connection between the bending skeleton and the flexible supporting bar.

2. The supporting structure of claim 1, wherein the connecting portions are bar-shaped connecting portions.

3. The supporting structure of claim 2, wherein the bar-shaped connecting portions are arranged in parallel and are extended in an extension direction of the flexible supporting bar.

4. The supporting structure of claim 1, wherein the flexible supporting bar is on a side of the bending supporting portion in proximity to the flexible display screen.

5. The supporting structure of claim 1, wherein the flexible supporting bar is configured to bend with the flexible display screen.

6. The supporting structure of claim 1 further comprising planar supporting portions that are opposite to planar regions of the flexible display screen.

7. The supporting structure of claim 1, wherein the bending supporting portion is opposite to the bending region of the flexible display screen.

8. The supporting structure of claim 1, wherein the flexible supporting bar comprises a supporting portion in contact with the flexible display screen, and wherein the connecting portions of the flexible supporting bar are distributed at intervals and fastened to the supporting portion.

9. The supporting structure of claim 8, wherein the connecting portions are on a side of the supporting portion awway from the flexible display screen, and wherein an end of the connecting portions awway from the supporting portion is coupled to the bending skeleton.

10. The supporting structure of claim 1, wherein a material of the flexible supporting bar comprises rubber.

11. The supporting structure of claim 1, wherein the connecting portions are flexible connecting portions.

12. The supporting structure of claim 1, wherein the clamping heads extend into the clamping slots to implement connection between the flexible supporting bar and the bending skeleton.

13. A foldable display apparatus comprising:
    a bending region;
    a flexible display screen comprising a part that is located in the bending region; and
    a supporting structure configured to support the foldable display apparatus, wherein the supporting structure comprises:
        a bending supporting portion that supports the bending region, wherein the bending supporting portion comprises:
            a bending skeleton comprising clamping heads, wherein the clamping heads are aligned in respective and parallel first planes; and
            a flexible supporting bar configured to be in direct contact with the flexible display screen and comprising:
                a first side fastened to the part in a second plane parallel to an unfolded surface of the flexible display screen, wherein the second plane is perpendicular to the first planes; and
                a second side coupled to the bending skeleton via connecting portions that are distributed at intervals,
            wherein the connecting portions comprise clamping slots that clamp with the clamping heads to secure a connection between the bending skeleton and the flexible supporting bar.

14. The foldable display apparatus of claim 13, wherein the foldable display apparatus is configured to fold in a direction towards the flexible display screen or in a direction away from the flexible display screen.

15. The foldable display apparatus of claim 13, wherein a material of the flexible supporting bar comprises rubber.

16. The foldable display apparatus of claim 13, wherein the connecting portions are bar-shaped connecting portions or dot-shaped connecting portions.

17. The foldable display apparatus of claim 13, wherein the bar-shaped connecting portions are arranged in parallel and are extended in an extension direction of the flexible supporting bar.

18. The foldable display apparatus of claim 13, wherein the connecting portions are flexible connecting portions.

19. The foldable display apparatus of claim 13, wherein the clamping heads extend into the clamping slots to implement connection between the flexible supporting bar and the bending skeleton.

20. The foldable display apparatus of claim 13, wherein the clamping slots deform when the bending supporting portion is bent.

* * * * *

UNITED STATES PATENT AND TRADEMARK OFFICE
CERTIFICATE OF CORRECTION

PATENT NO. : 12,250,779 B2  
APPLICATION NO. : 17/606178  
DATED : March 11, 2025  
INVENTOR(S) : Yin Li and Chunjun Ma Page 1 of 1

It is certified that error appears in the above-identified patent and that said Letters Patent is hereby corrected as shown below:

In the Claims

Claim 9, Column 14, Line 15: "portions awway from" should read "portions away from"

Signed and Sealed this  
Sixth Day of May, 2025

Coke Morgan Stewart  
*Acting Director of the United States Patent and Trademark Office*